US009644260B1

(12) United States Patent
Groves (10) Patent No.: US 9,644,260 B1
(45) Date of Patent: May 9, 2017

(54) PORTABLE SPUTTERING APPARATUS AND METHOD

(71) Applicant: Oliver James Groves, Freeland, WA (US)

(72) Inventor: Oliver James Groves, Freeland, WA (US)

( * ) Notice: Subject to any disclaimer, the term of this patent is extended or adjusted under 35 U.S.C. 154(b) by 1085 days.

(21) Appl. No.: 13/708,808

(22) Filed: Dec. 7, 2012

Related U.S. Application Data

(60) Provisional application No. 61/611,595, filed on Mar. 16, 2012.

(51) Int. Cl.
*C23C 14/34* (2006.01)
*H01J 37/34* (2006.01)

(52) U.S. Cl.
CPC ................................ *C23C 14/3407* (2013.01)

(58) Field of Classification Search
CPC . H01J 37/3447; H01J 37/3488; H01J 37/3411
USPC ............................ 204/298.07, 298.15, 298.11
See application file for complete search history.

(56) References Cited

U.S. PATENT DOCUMENTS

| 3,649,512 A | * | 3/1972 | Ackely | C23C 14/3407 |
| | | | | 204/298.09 |
| 3,981,791 A | * | 9/1976 | Rosvold | C23C 14/566 |
| | | | | 118/50 |
| 5,660,693 A | * | 8/1997 | Abramson | C03C 17/001 |
| | | | | 204/192.12 |

* cited by examiner

*Primary Examiner* — Rodney McDonald
(74) *Attorney, Agent, or Firm* — Michael D. Eisenberg (57) ABSTRACT

A portable sputtering apparatus for repairing the damaged surface on aircrafts comprises: a cylindrical chamber, having a top chamber plate and a bottom chamber plate. The cylindrical chamber comprises a welded flange for attachment to a high vacuum system and a first tube and flange assembly for attachment to an inert gas bottle. The top chamber plate comprises a cathode housing, comprising a cathode coated with the material to be sputtered onto the surface of the aircraft, and a second tube and flange assembly for discharge of pressure within the chamber. The bottom chamber plate comprises a second housing that attaches to the surface of an aircraft. Within the second housing is a metal sheet, having an aperture that allows sputtered material to flow onto the surface of the aircraft. The material to be sputtered may be carbon composite or copper.

17 Claims, 11 Drawing Sheets

PORTABLE SPUTTERING APPARATUS AND METHOD

CROSS-REFERENCES TO RELATED APPLICATIONS

The present application claims priority from U.S. Provisional Application Ser. No. 61/611,595 filed on Mar. 3, 2012, which is hereby incorporated herein by reference in its entirety.

TECHNICAL FIELD

The present invention, in some embodiments thereof, relates to a portable sputtering apparatus and method for repairing damaged composite material on aircrafts.

BACKGROUND OF THE INVENTION

In the field of aviation, damaged composite areas on panels or the surfaces on aircraft wings, including the empennage sections, are either removed from the aircraft or the fuel is removed from the aircraft before servicing. It would therefore be advantageous to have a portable sputtering apparatus that can be directly attached to an aircraft and sputter carbon composite material onto the damaged area. Sputtering carbon composite material onto the airplane surface under controlled conditions restores the damaged area's original shape and condition.

BRIEF SUMMARY OF EMBODIMENTS OF THE INVENTION

The present invention relates to a portable sputtering apparatus comprising a cylindrical chamber, having a top chamber plate and a bottom chamber plate. The cylindrical chamber comprises a welded flange for attachment to a high vacuum system and a first tube and flange assembly for attachment to an inert gas bottle. The top chamber plate comprises a cathode housing, comprising of a cathode coated with material to be sputtered, and a second tube and flange assembly for discharge of pressure within the chamber. The bottom chamber plate comprises a second housing that attaches to the surface of an aircraft. Within the second housing is a metal sheet, having an aperture that allows sputtered composite material to flow onto the surface of an aircraft. The material to be sputtered may be carbon composite or copper. The portable sputtering apparatus is comprised of at least one of stainless steel, aluminum, and glass.

Optionally, the top chamber plate of the portable sputtering apparatus may comprise a viewing lens and a plurality of hook clamp assemblies that attach the cathode housing to the top chamber plate. Additionally, a first O-ring may be placed between the cathode housing and the top chamber plate; a second O-ring may be placed between the second housing, that attaches to the surface of an aircraft, and the bottom chamber plate; and a third O-ring may be placed between the second housing and the surface of an aircraft.

A method for sputtering onto a damaged surface, using a portable sputtering apparatus comprises: identifying the curvature of the damaged surface; machining a housing, comprising an aperture, a first end, and a second end, wherein the second end matches the curvature of the damaged surface; receiving a portable sputtering apparatus comprising: a cylindrical chamber, having a top and a bottom, wherein the chamber comprises a welded flange and a first tube and flange assembly; a top chamber plate, connected to the top of the cylindrical chamber, having a plurality of apertures, comprising: a first aperture covered with a cathode housing, comprising a cathode coated with the material to be sputtered; a second aperture connected to a second tube and flange assembly for the discharge of pressure within the chamber; and a bottom chamber plate, having an aperture, connected to the bottom of the cylindrical chamber; and a metal sheet, having an aperture; placing the metal sheet inside the housing; attaching the first end of the housing to the bottom chamber plate; placing the portable sputtering apparatus with the housing, and the metal sheet into a frame weldment; attaching a vacuum gate valve to the welded flange; attaching an air cooled cryopump to the vacuum gate valve; attaching a rough mechanical pump to a welded flange on the air cooled cryopump; attaching a bottle of inert gas to the first tube and flange assembly; loading the portable sputtering apparatus with the housing, the metal sheet, the frame weldment, the vacuum gate valve, the air cooled cryopump, rough mechanical pump, and inert gas bottle onto the damaged surface so that the second end of the housing is in contact with the damaged surface; applying a high DC voltage (1-5K.V.) so that the metal plate has a negative field and the cathode has a positive field; turning on the rough mechanical pump; and turning on the air cooled cryopump to begin sputtering onto the damaged surface.

Other features and aspects of the invention will become apparent from the following detailed description, taken in conjunction with the accompanying drawings, which illustrate, by way of example, the features in accordance with embodiments of the invention. The summary is not intended to limit the scope of the invention, which is defined solely by the claims attached hereto.

BRIEF DESCRIPTION OF THE DRAWINGS

The present invention, in accordance with one or more various embodiments, is described in detail with reference to the following figures. The drawings are provided for purposes of illustration only and merely depict typical or example embodiments of the invention. These drawings are provided to facilitate the reader's understanding of the invention and shall not be considered limiting of the breadth, scope, or applicability of the invention. It should be noted that for clarity and ease of illustration these drawings are not necessarily made to scale.

Some of the figures included herein illustrate various embodiments of the invention from different viewing angles. Although the accompanying descriptive text may refer to such views as "top," "bottom" or "side" views, such references are merely descriptive and do not imply or require that the invention be implemented or used in a particular spatial orientation unless explicitly stated otherwise.

The figures are not intended to be exhaustive or to limit the invention to the precise form disclosed. It should be understood that the invention can be practiced with modification and alteration, and that the invention be limited only by the claims and the equivalents thereof.

DETAILED DESCRIPTION OF THE EMBODIMENTS OF THE INVENTION

From time-to-time, the present invention is described herein in terms of example environments. Description in terms of these environments is provided to allow the various features and embodiments of the invention to be portrayed in the context of an exemplary application. After reading this description, it will become apparent to one of ordinary skill in the art how the invention can be implemented in different and alternative environments.

Unless defined otherwise, all technical and scientific terms used herein have the same meaning as is commonly understood by one of ordinary skill in the art to which this invention belongs. All patents, applications, published applications and other publications referred to herein are incorporated by reference in their entirety. If a definition set forth in this section is contrary to or otherwise inconsistent with a definition set forth in applications, published applications and other publications that are herein incorporated by reference, the definition set forth in this document prevails over the definition that is incorporated herein by reference.

The present invention, in some embodiments thereof, relates to a portable sputtering apparatus 10 that is designed to work with existing vacuum and sputtering technology for repairing the damaged composite material on aircrafts. Referring to FIGS. 1-16, the portable sputtering apparatus 10 comprises a chamber 12, having a top and a bottom. The top of the chamber 12 comprises a cathode assembly 14 and the bottom of the chamber 12 comprises a template assembly 16.

FIGS. 3-8 refer to the cathode assembly 14. The cathode assembly 14 comprises a top chamber plate 18, a cathode housing 20, a first O-ring 22, a viewing lens 24, a tube and flange assembly 26, and hook clamp assemblies 28.

Figure 4:
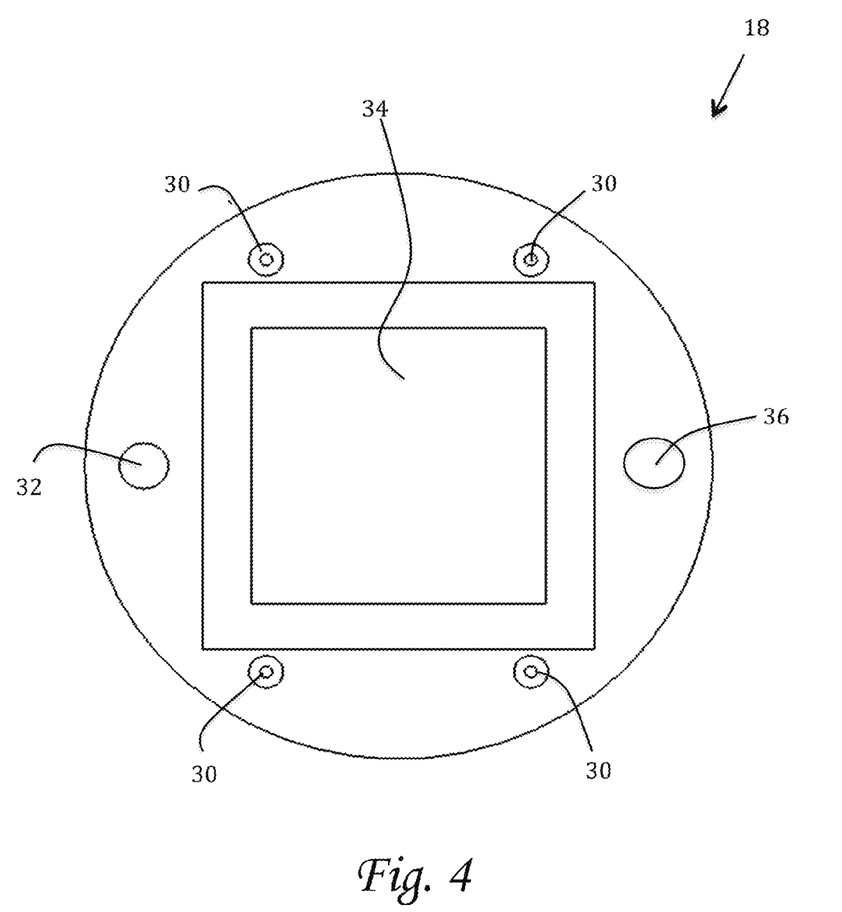
FIG. 4 is a plan view of the top chamber plate in FIG. 3.
Figure 5:
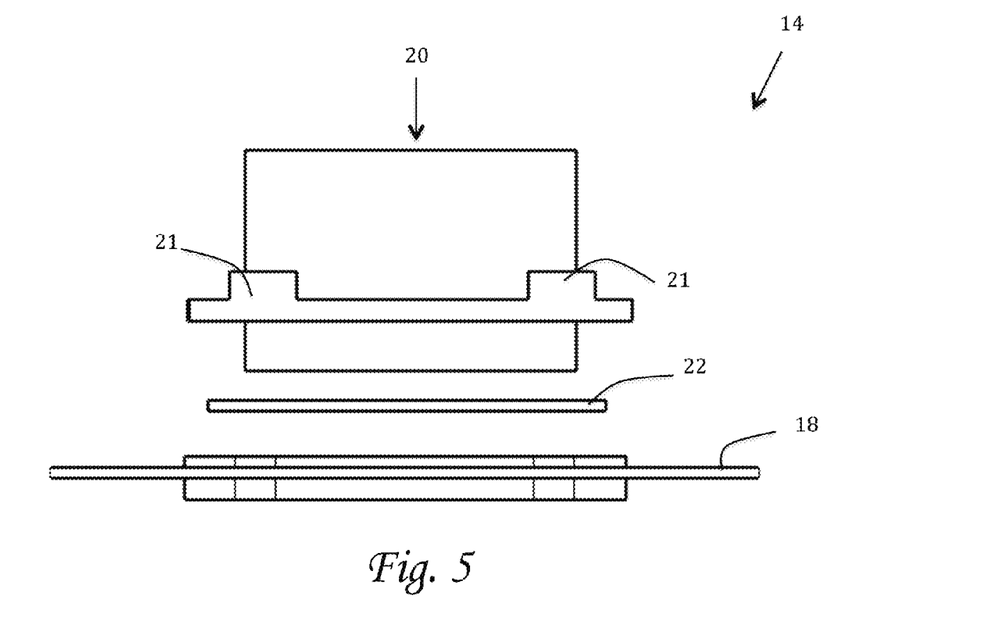
FIG. 5 is a profile view of the cathode housing, the first O-ring, and, top chamber plate of the cathode assembly in FIG. 3.

In FIG. 4, the top chamber plate 18 comprises a plurality of apertures and threaded bosses 30. The first aperture 32 connects to the shaft 44 of the viewing lens 24. The second aperture 34 connects to cathode housing 20. Although the second aperture 34 is shown as a square in the figures, the second aperture 34 may be any shape that matches the cathode housing 20. The third aperture 36 connects to the tube 27 in the first tube and flange assembly 26. The threaded boss 30 connects to the stud 48 of a hook clamp assembly 28. The top chamber plate 18 is welded to the top of the chamber 12.

The cathode housing 20 is shown in FIGS. 1-3, 5, and 15. The cathode housing 20 comprises a cathode, coated with the material (i.e. carbon composite or copper) to be sputtered onto the aircraft, and a plurality of oval shaped magnets (not shown). The outside of the cathode housing 20 comprises a plurality of protrusions 21 that serve as attachment points for the hook clamp assemblies 28 that secure the cathode housing 20 to the top chamber plate 18. Between the cathode housing 20 and the top chamber plate 18 is a first O-ring 22 that is sized and dimensioned for fitting around the perimeter of the second aperture 34 in the top chamber plate 18. The first O-ring 22 ensures that an air-tight seal forms between the cathode housing 20 and the top chamber plate 18. While the cathode housing 20 is shown as a square shape in the figures, the cathode housing 20 may be any shape to support the cathode.

Figure 6:
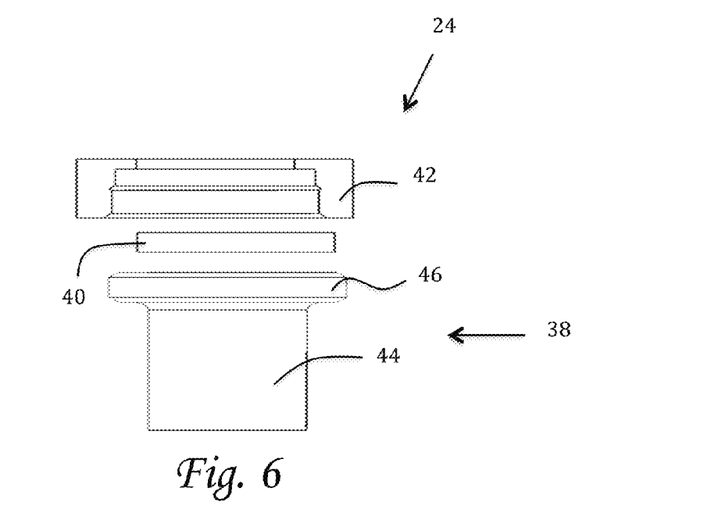
FIG. 6 is a profile view of the viewing lens of the portable sputtering apparatus in FIG. 1.

Referring to FIG. 6, the viewing lens 24 allows a technician to look directly into the chamber 12 to observe the amount of material being deposited onto the surface of the aircraft. The viewing lens 24 comprises a base 38, a lens 40, and a cap 42 with internal threads. The base 38 further comprises a hollow cylindrical shaft 44, having a circular flange 46 with external threads at one end of the shaft 44. The end of the shaft 44 without the circular flange 46 connects to the first aperture 32 on the top chamber plate 18. The other end with the circular flange 46 and external threads connects to the cap 42. The cylindrical shaft 44 prevents sputtered particles from coming into contact with the lens 40.

The circular flange 46 is sized and dimensioned for receiving the lens 40 and the cap 42. The lens 40 rests upon the flange 46 and is composed of at least one of glass and a clear polymer material. The cap 42 is sized and dimensioned for fitting over the flange 46 and lens 40 to secure the lens 40 in place. Optionally, an O-ring may be placed between the lens 40 and the flange 46. While only one viewing lens 24 is shown in the figures, additional viewing lenses 24 may be added.

Figure 7:
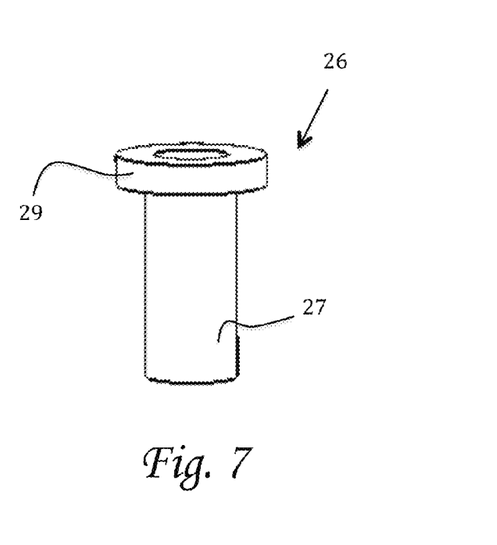
FIG. 7 is a perspective view of the tube and flange assembly of the portable sputtering apparatus in FIG. 1.

In FIG. 7, the first tube and flange assembly 26 comprises a tube 27 and a circular flange 29 at one end of the tube 27. The end of the tube 27 without the circular flange 29 connects to the third aperture 36 in the top chamber plate 18. The end of the tube 27 with the circular flange 29 connects to a valve (not shown) that is part of the vacuum system of the portable sputtering apparatus 10 and allows for the discharge of pressure within the chamber 12.

Figure 8:
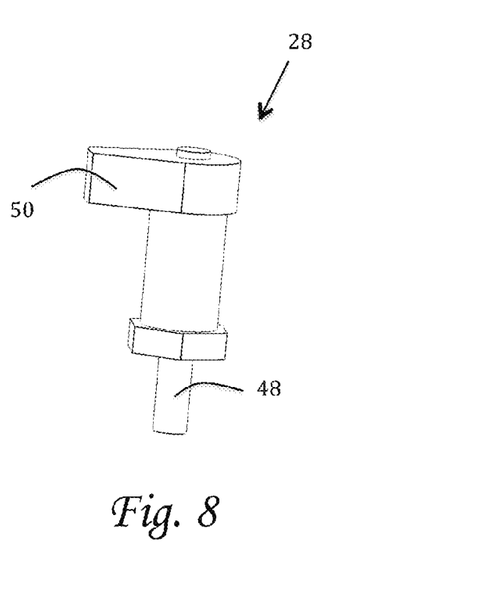
FIG. 8 is a perspective view of the hook clamp assembly of the portable sputtering apparatus in FIG. 1.

The commercially available hook clamp assemblies 28, comprise a stud 48 and a cap 50, as shown in FIG. 8. The stud 48 is welded into a threaded boss 30 on the top chamber plate 18. The cap 50 hooks onto a protrusion 21 on top of the cathode housing 20 and is screwed into place. These hook clamp assemblies 28 provide a direct downward clamping force, while also remaining low in profile.

Figure 9:
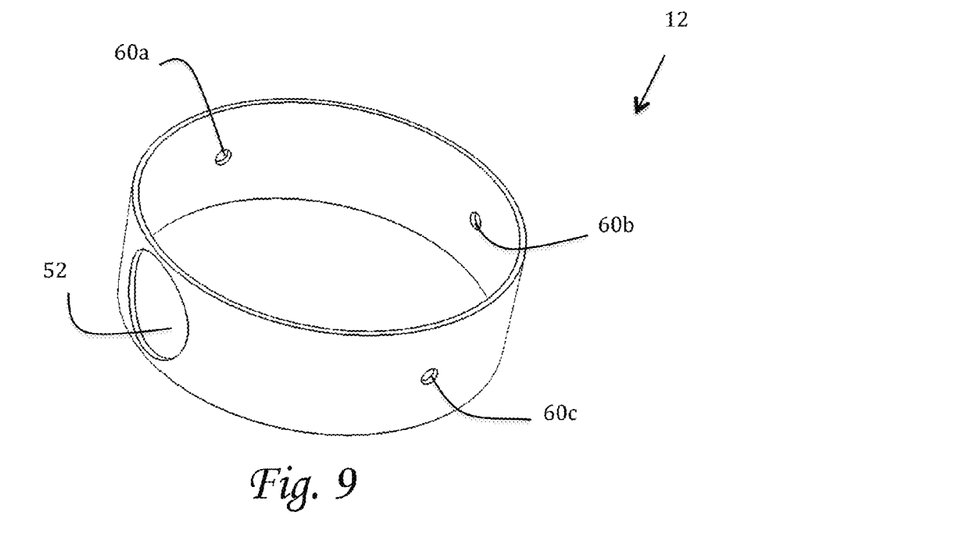
FIG. 9 is the chamber of the portable sputtering apparatus in FIG. 1.
Figure 10:
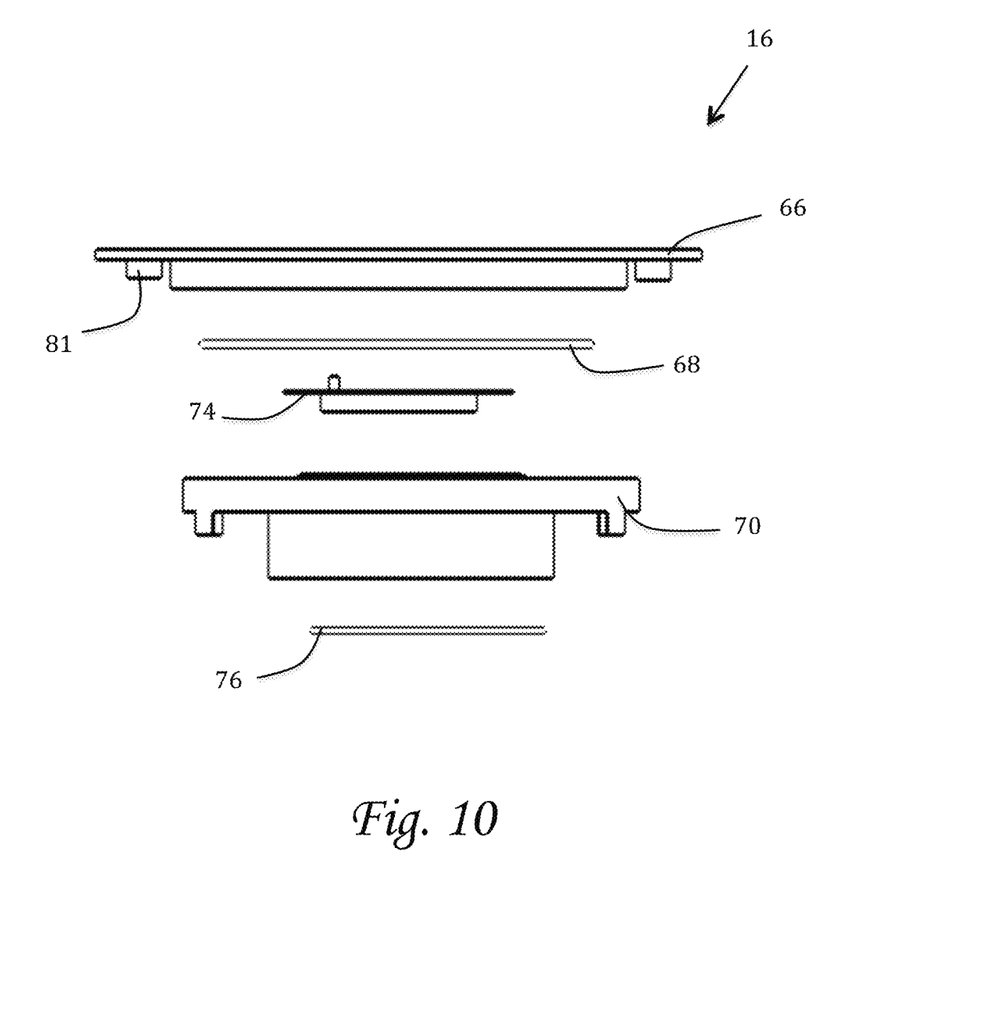
FIG. 10 is the template assembly of the portable sputtering apparatus in FIG. 3.

The chamber 12 is shown in FIG. 9. The chamber 12 comprises a cylindrical sleeve, having a plurality of apertures along the circumference of the sleeve. A first aperture 52 is sized and dimensioned for the welded flange 54. The other apertures 60a, 60b, and 60c are connected to tube and flange assemblies 62a, 62b, and 62c respectively. Although the chamber 12 may comprise any shape, the chamber 12 is cylindrical in the preferred embodiment. This shape is not only easier to construct, but also provides higher sealing characteristics and structural strength for a vacuum chamber.

The second welded flange 54 connects to a vacuum pump 96. It is suggested that an air-cooled cryopump be used with the portable sputtering apparatus 10 because it pulls a vacuum faster when used in the inverted position.

The tube and flange assemblies 62a, 62b, and 62c have the same structure as the first tube and flange assembly 26 and comprise a tube 27 and circular flange 29 at one end of the tube 27. The end of the tube 27 without the circular flange 29 connects to the chamber 12. The end of the tube 27 with the circular flange 29 connects to an inert gas bottle, an ionization vacuum gauge, a temperature gauge, or a thermocouple. For the tube and flange assembly 62a, 62b, or 62c with the inert gas bottle, a needle flow control valve and flow meter with a shutoff valve may be used to allow a technician to exchange the gas bottle while maintaining a vacuum in the portable sputtering apparatus 10. When not in use, the tube and flange assemblies 62a, 62b, and 62c may be plugged.

Attached to the chamber 12 are two blocks 64, as shown in FIGS. 1-3 and 15. One side of the block 64 matches the curvature of the cylindrical chamber 12 and the other side is flat with a point of attachment to the frame weldment 88. The blocks 64 secure the chamber 12 to the frame weldment 88 so that the portable sputtering chamber assembly 10 does not move when being lifted onto an aircraft.

The template assembly 16 is shown in FIGS. 3 and 10-14. The template assembly comprises a bottom chamber plate 66, a second O-ring 68, an aircraft template 70, a plurality of hook clamp assemblies 28, a plurality of load cells 72, a substrate template 74, and a third O-ring 76.

Figure 11:
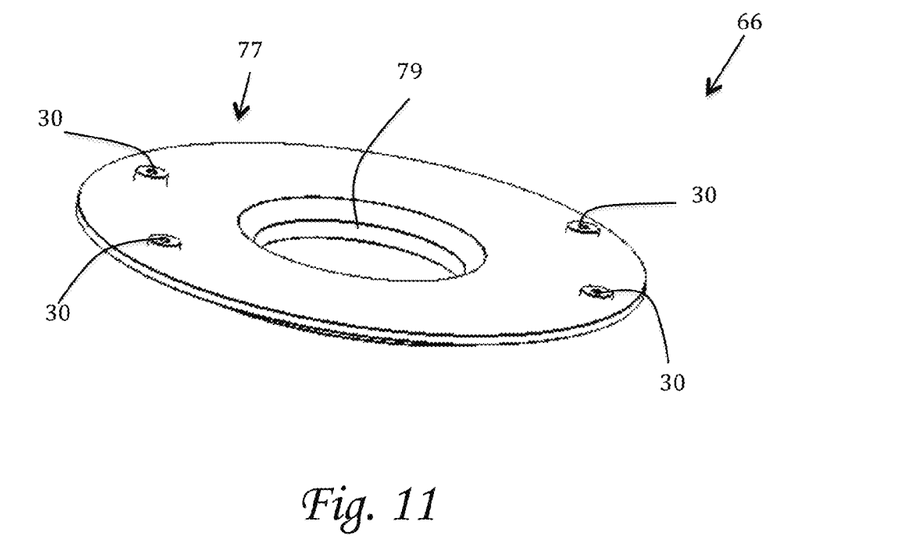
FIG. 11 is a perspective view of the bottom chamber plate in the template assembly in FIG. 10.
Figure 12:
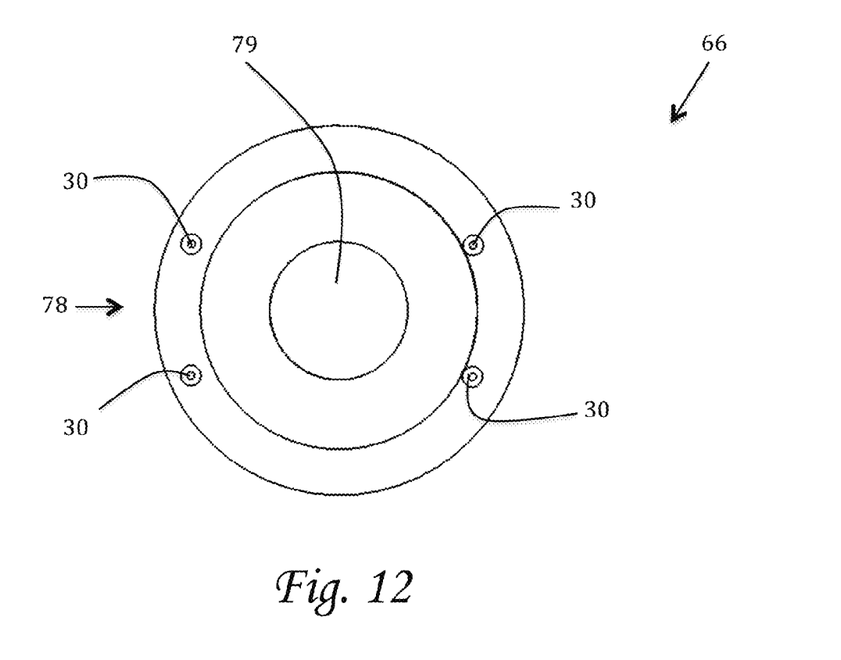
FIG. 12 is a plan view of the bottom side of the bottom chamber plate of FIG. 11.

Referring to FIG. 11, the bottom chamber plate 66 comprises a top side 77, a bottom side 78, an aperture 79 and a plurality of threaded bosses 30 along the circumference of the aperture 79. The top side 77 is welded to the bottom of the chamber 12. The bottom side 78 attaches to the aircraft template 70 with a plurality of hook clamp assemblies 28 in the threaded bosses 30. The aperture 79 allows sputtered material to flow from the chamber 12 to the substrate template 74. Although the bottom chamber plate 66 is shown as circular disk in the figures, the chamber plate 66 may be any shape that matches the chamber 12. Likewise the aperture 79, which is shown as a circle, may have any shape.

Figure 13:
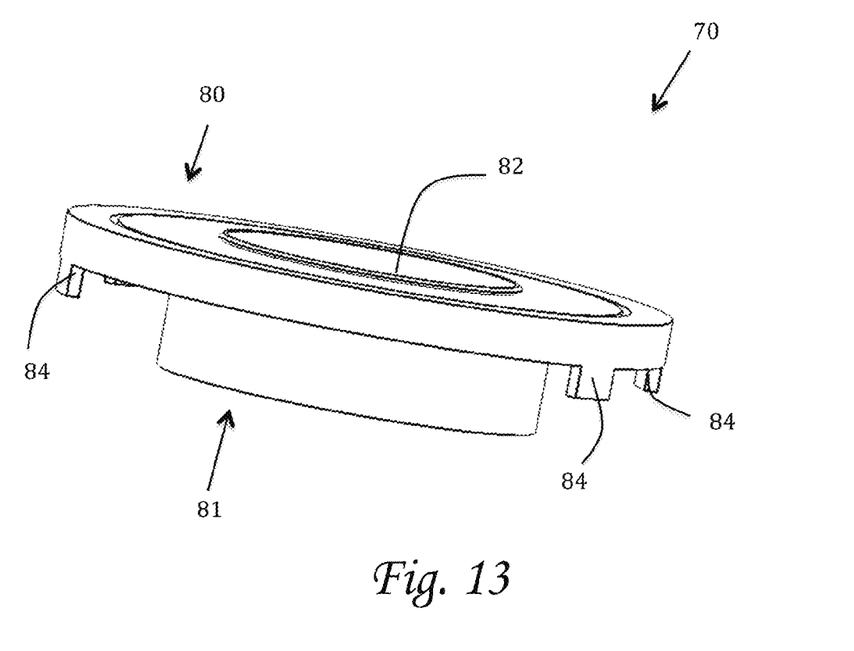
FIG. 13 is a perspective view of the aircraft template in the template assembly in FIG. 10.

Referring to FIG. 13, the aircraft template 70 comprises a first end 80, a second end 81, and an aperture 82. Similar to the cathode housing 20, the aircraft template 70 has a plurality of tabs 84 that allow the first end 78 of the aircraft template 70 to attach to the bottom chamber plate 66 with a plurality of hook clamp assemblies 28. The second end 81 attaches to the surface of an aircraft and matches the curvature of the aircraft so that when the aircraft template 70 rests on an aircraft's surface, a flat surface is formed. Although the aircraft template 70 in the figures has a flat, circular disk shape suitable for a flat circular section of an aircraft, the aircraft template 70 can be a housing in any geometric shape. For instance, for some parts of an aircraft, the template 70 may have a curved second end 81 to match the curved surface of an aircraft. Thus, the template 70 is removable and interchangeable, but the second end 81 must be machined to an aircraft's curvature.

A second O-ring 68 is located between the bottom chamber plate 66 and the aircraft template 70 to ensure a tight seal between the two parts.

Figure 1:
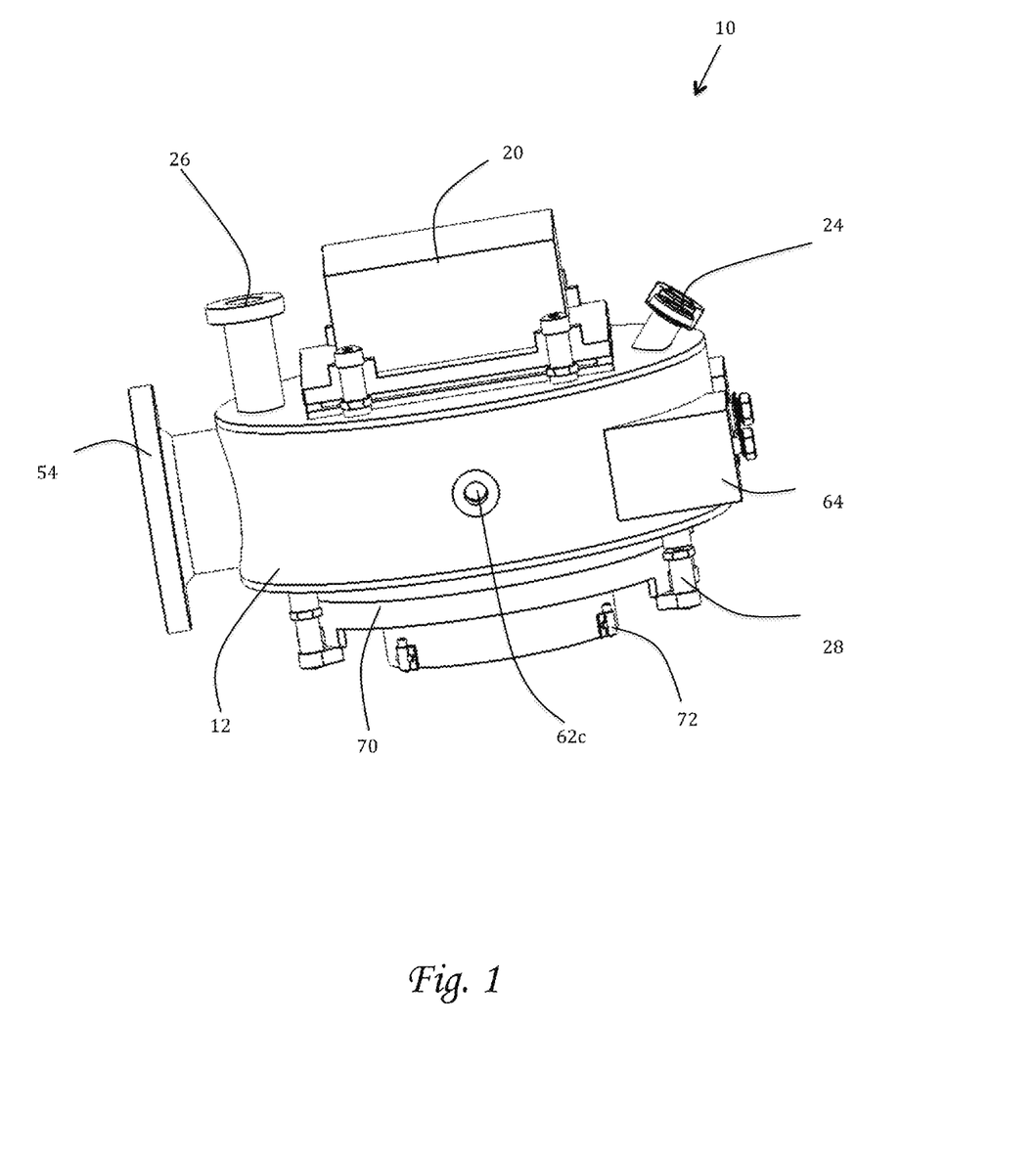
FIG. 1 is a perspective view of the portable sputtering apparatus.
Figure 2:
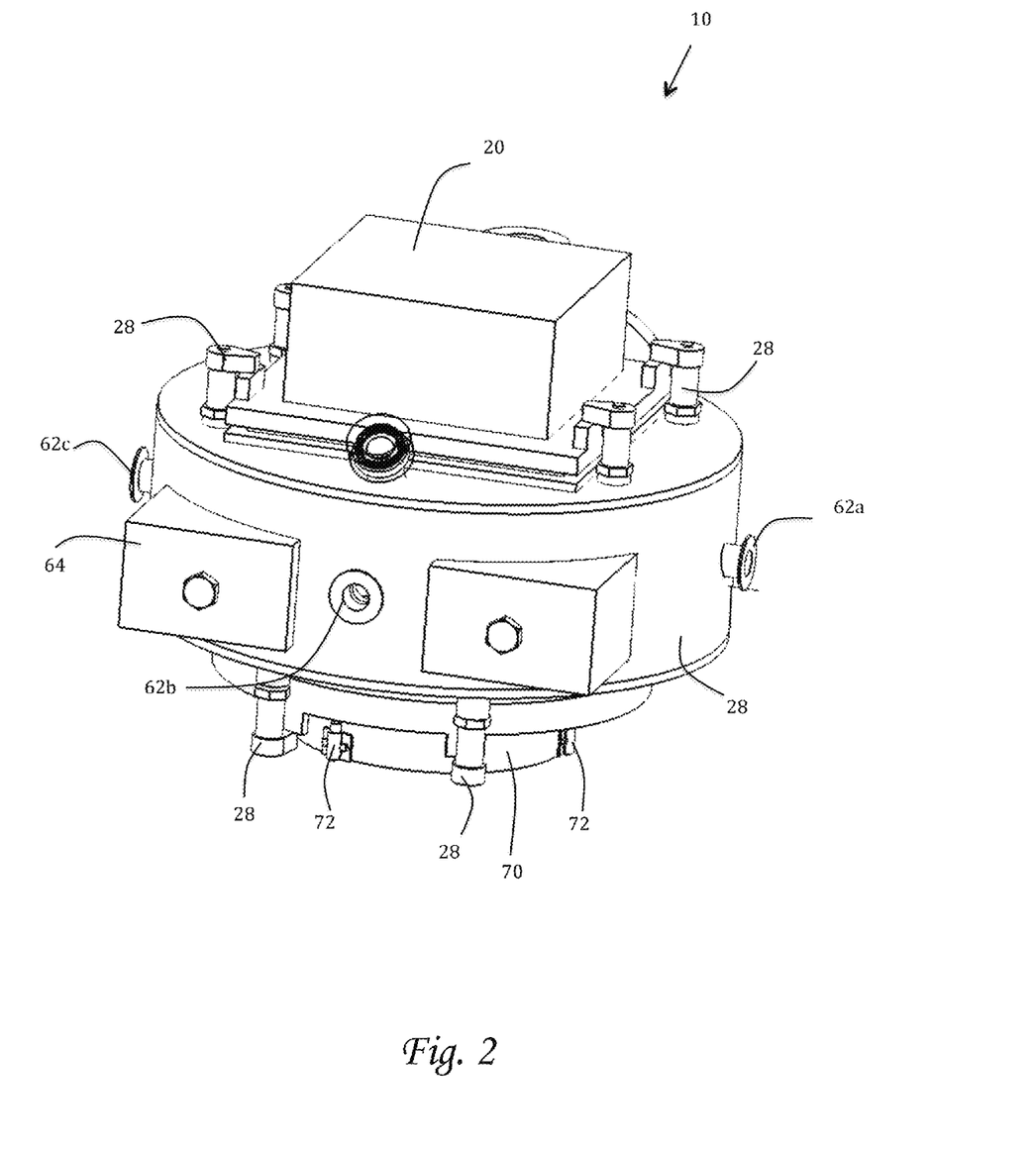
FIG. 2 is a rear view of the portable sputtering apparatus in FIG. 1.
Figure 3:
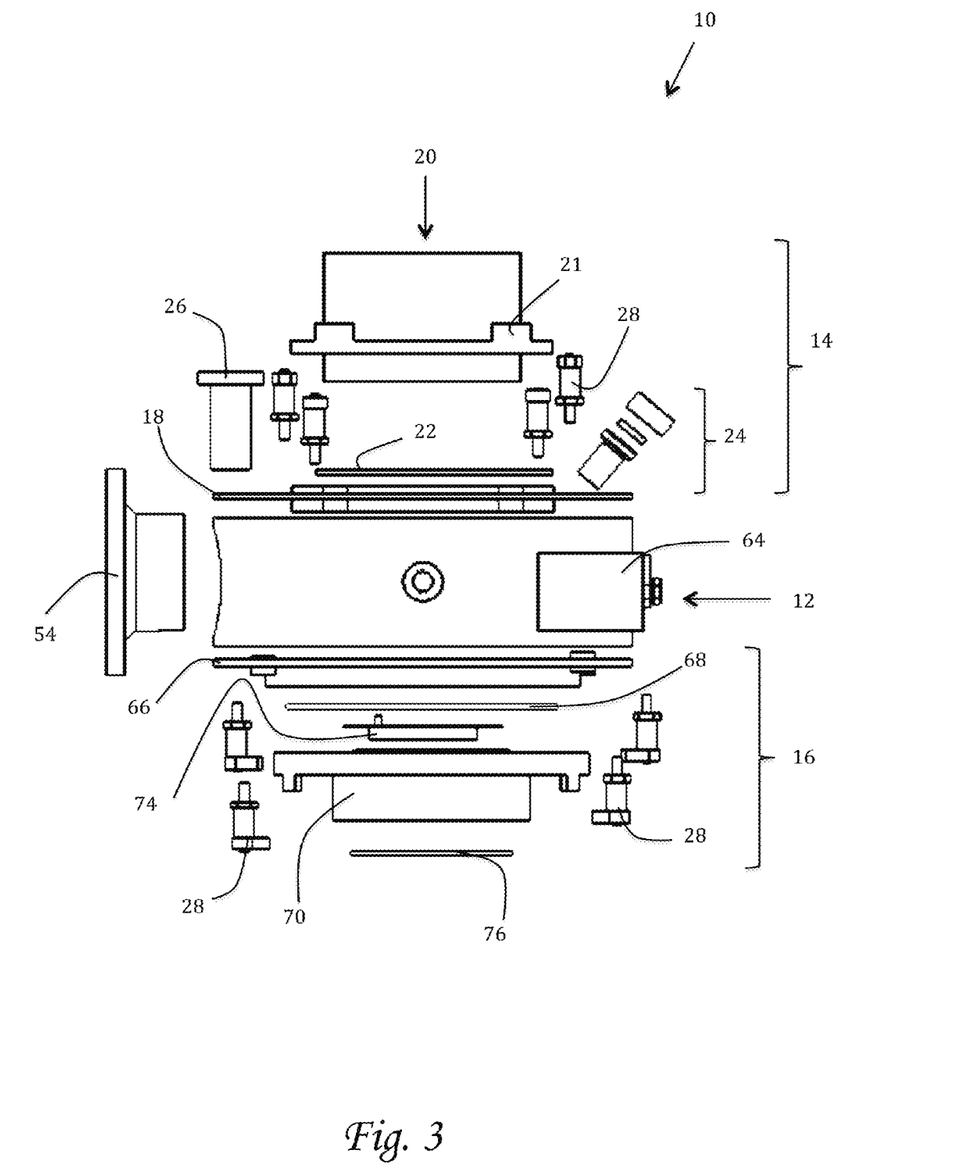
FIG. 3 is an exploded profile view of the portable sputtering apparatus in FIG. 1.
Figure 16:
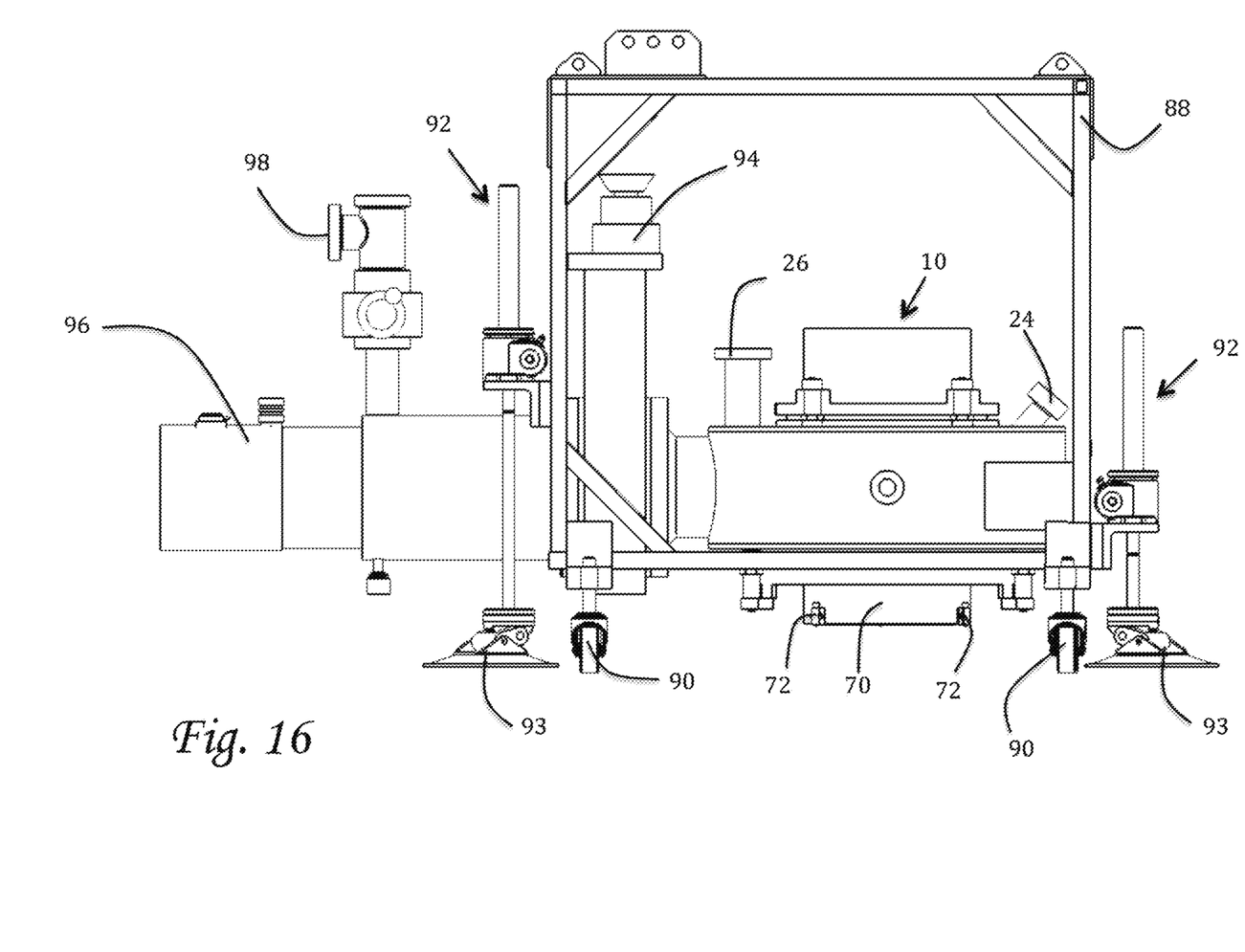
FIG. 16 is a profile view of the portable sputtering apparatus with existing vacuum technology in FIG. 15.

The aircraft template 70 also comprises a plurality of wireless load cells 72, as shown in FIGS. 1-2 and 16. Since the portable vacuum apparatus 10 is loaded onto an aircraft with a crane, the load cells 72 are useful for informing an operator when the aircraft template 70 is in contact with the surface of the aircraft so the vacuum process can be started. While three load cells 72 are shown in the figures, any number of load cells 72 may be used.

Figure 14:
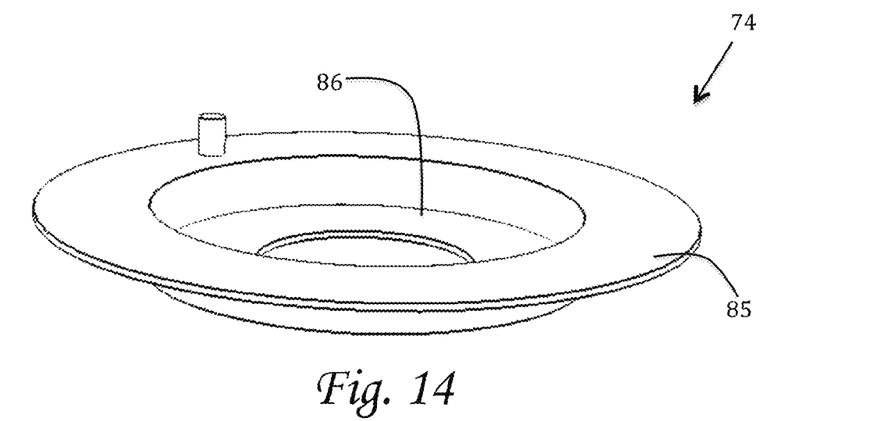
FIG. 14 is a perspective view of the substrate template in the template assembly in FIG. 10.

Referring to FIG. 14, the substrate template 74 comprises a metal sheet 85 and an aperture 86 and is located inside the aircraft template 70. The aperture 86 may be any shape that fits within the aircraft template 70 and matches the shape of the surface of the aircraft to be sputtered. When the portable sputtering apparatus 10 is in use, the substrate template 74 has a negative field that attracts the sputtered composite material onto the surface of an aircraft.

The third O-ring 76 is located between the aircraft template 70 and the surface of the aircraft to ensure a tight seal between the portable sputtering apparatus 10 and the aircraft. The cross sectional area of the third O-ring 76 should be twice as large as its diameter to provide more surface area to accommodate the curvature of the surface of the aircraft. The first O-ring 22, second O-ring 68, and third O-ring 76 are comprised of a least one of silicon and a polymer material.

Unless otherwise specified, the parts of the portable sputtering apparatus 10 are comprised of at least one of stainless steel, aluminum, and glass. Additionally, even though sputtering is achieved at lower pressure the portable sputtering apparatus 10 should be constructed so that it can provide a high vacuum of $(5 \times 10^{-5}$ Torr).

Before using the portable sputtering apparatus 10, the surface of the aircraft to be sputtered must be cleaned and the water must be removed.

Figure 15:
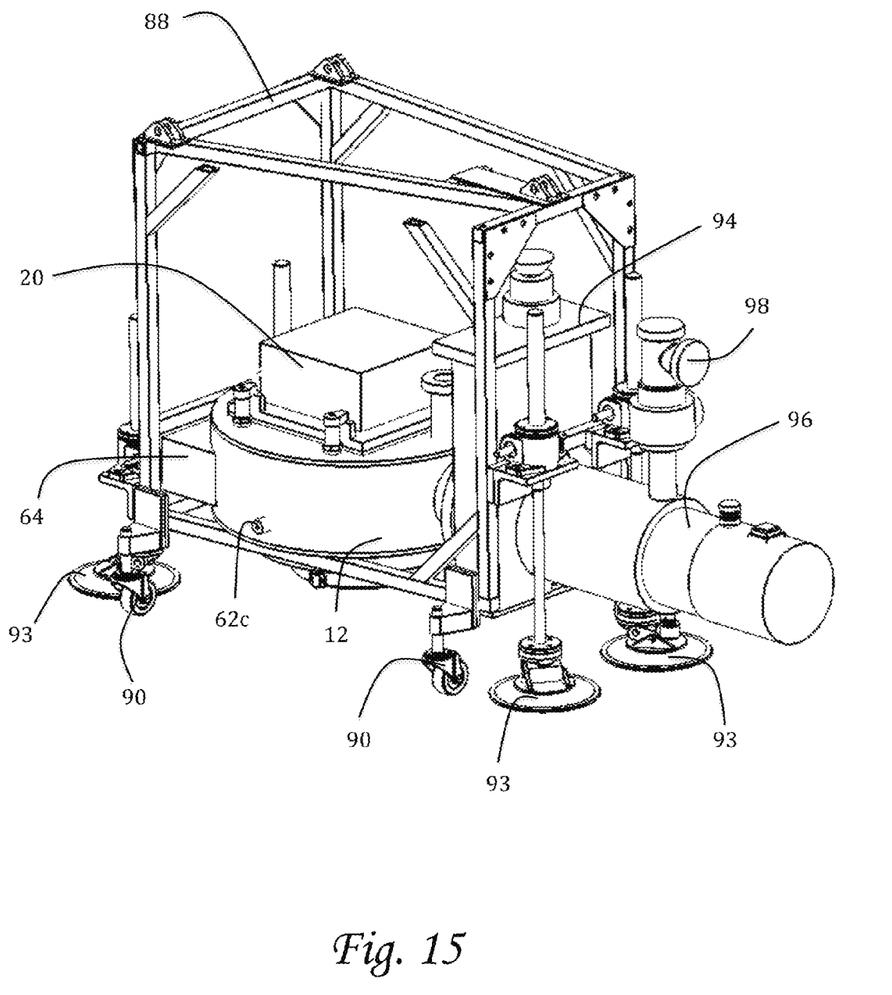
FIG. 15 is a perspective view of the portable sputtering apparatus with existing vacuum technology.

FIGS. 15-16 show a typical set-up with the portable sputtering apparatus 10. The portable sputtering apparatus is placed onto a frame weldment 88 comprising a plurality of spring loaded casters 90, mechanical jacks 92, and vacuum cups 93. The welded flange 54 is connected to a vacuum gate valve 94. The vacuum gate valve 94 is further connected to an air-cooled cryopump 96. A valve 98 on the air-cooled cyropump connects to a rough mechanical pump (not shown). A bottle of inert gas is attached to one of the tube and flange assemblies 62a, 62b, or 62c. This entire assembly is then loaded into position on the damaged surface of an aircraft using an overhead crane. The spring loaded casters 90 compress onto the surface by using the jack screws 92 and the vacuum cups 93 to secure the total assembly to the aircraft surface. The load cells 72 on the aircraft template 70 signal the technician that the portable sputtering apparatus 10 is attached to the damaged surface. A DC power supply is used to supply a high frequency voltage and a negative DC voltage so that the substrate template 74 has a negative charge and the cathode housing 20 has a positive charge. The rough mechanical pump is turned on to achieve a rough vacuum. Finally, the air cooled cryopump 96 is turned on and the sputtering process begins.

The inert gas depends on the material that will be sputtered onto the aircraft. Xenon gas should be used with carbon composite material. Argon gas should be used with copper.

Nitrogen, an inert gas, should be used to collect and remove water vapor, oxygen, and other gases from inside the chamber. The cryopump 96 or the rough mechanical pump vents these gases to the atmosphere.

After sputtering, the surface may need to be sanded and painted.

If the part of the aircraft to be repaired has an aperture, extending through the part, the part should be removed from the aircraft. One side of the aperture is covered with a sealed O-ring cover that attaches to the part with suction cups or a similar means. The O-ring cover has a similar size and configuration as the aircraft template 70. The other side of the aperture attaches to the aircraft template 70. The part can then be repaired with the portable sputtering apparatus 10 by the previously described procedure. In some cases, a second vacuum chamber may be required around the O-ring to allow sputtered material to pass through the aperture.

A method for repairing the damaged surface of an aircraft, using a portable sputtering apparatus 10 comprises: identifying the curvature of the damaged surface; machining an aircraft template 70 comprising a first end 80, a second end 82, and an aperture 83 so that the second end 82 matches the curvature of the damaged surface; receiving a portable sputtering apparatus 10, comprising a chamber 12, a cathode assembly 14 and a template assembly 16, wherein the cathode assembly 14 comprises a top chamber plate 18, a cathode housing 20, and a first tube and flange assembly 26; the chamber 12 comprises a welded flange 54 and a plurality of tube and flange assemblies 62a, 62b, and 62c; and the template assembly 16 comprises a bottom chamber plate 66 and a substrate template 74; placing the substrate template 74 inside the aircraft template 70; attaching the aircraft template 70 to the bottom chamber plate 66, placing the portable sputtering apparatus 10 with the aircraft template 70 in a frame weldment 88; attaching a vacuum gate valve 94 to the welded flange 54; attaching an air-cooled cryopump 96 to the vacuum gate valve; attaching a rough mechanical pump (not shown) to the welded flange 98 on the air cooled cryopump 96; attaching a bottle of inert gas to one of the tube and flange assemblies 62a, 62b, and 62c on the chamber 12; loading the frame weldment 88 with the portable sputtering apparatus 20, vacuum gate valve 94, air cooled cryopump 96, rough mechanical pump, and inert gas bottle onto the damaged surface so that aircraft template 70 is in contact with the damaged surface; applying a high DC voltage (1-5K.V.) so that substrate template 74 has a negative field and the cathode housing 20 has a positive field; turning on the rough mechanical pump; and turning on the air cooled cryopump 96 to begin sputtering onto the damaged surface.

While various embodiments of the present invention have been described above, it should be understood that they have been presented by way of example only, and not of limitation. Likewise, the various diagrams may depict an example architectural or other configuration for the invention, which is done to aid in understanding the features and functionality that can be included in the invention. The invention is not restricted to the illustrated example architectures or configurations, but the desired features can be implemented using a variety of alternative architectures and configurations. Indeed, it will be apparent to one of skill in the art how alternative functional, logical or physical partitioning and configurations can be implemented to implement the desired features of the present invention. Also, a multitude of different constituent module names other than those depicted herein can be applied to the various partitions. Additionally, with regard to flow diagrams, operational descriptions and method claims, the order in which the steps are presented herein shall not mandate that various embodiments be implemented to perform the recited functionality in the same order unless the context dictates otherwise.

Although the invention is described above in terms of various exemplary embodiments and implementations, it should be understood that the various features, aspects and functionality described in one or more of the individual embodiments are not limited in their applicability to the particular embodiment with which they are described, but instead can be applied, alone or in various combinations, to one or more of the other embodiments of the invention, whether or not such embodiments are described and whether or not such features are presented as being a part of a described embodiment. Thus the breadth and scope of the present invention should not be limited by any of the above-described exemplary embodiments.

Terms and phrases used in this document, and variations thereof, unless otherwise expressly stated, should be construed as open ended as opposed to limiting. As examples of the foregoing: the term "including" should be read as meaning "including, without limitation" or the like; the term "example" is used to provide exemplary instances of the item in discussion, not an exhaustive or limiting list thereof; the terms "a" or "an" should be read as meaning "at least one," "one or more" or the like; and adjectives such as "conventional," "traditional," "normal," "standard," "known" and terms of similar meaning should not be construed as limiting the item described to a given time period or to an item available as of a given time, but instead should be read to encompass conventional, traditional, normal, or standard technologies that may be available or known now or at any time in the future. Likewise, where this document refers to technologies that would be apparent or known to one of ordinary skill in the art, such technologies encompass those apparent or known to the skilled artisan now or at any time in the future.

A group of items linked with the conjunction "and" should not be read as requiring that each and every one of those items be present in the grouping, but rather should be read as "and/or" unless expressly stated otherwise. Similarly, a group of items linked with the conjunction "or" should not be read as requiring mutual exclusivity among that group, but rather should also be read as "and/or" unless expressly stated otherwise. Furthermore, although items, elements or components of the invention may be described or claimed in the singular, the plural is contemplated to be within the scope thereof unless limitation to the singular is explicitly stated.

The presence of broadening words and phrases such as "one or more," "at least," "but not limited to" or other like phrases in some instances shall not be read to mean that the narrower case is intended or required in instances where such broadening phrases may be absent. The use of the term "module" does not imply that the components or functionality described or claimed as part of the module are all configured in a common package. Indeed, any or all of the various components of a module, whether control logic or other components, can be combined in a single package or separately maintained and can further be distributed across multiple locations.

It is appreciated that certain features of the invention, which are, for clarity, described in the context of separate embodiments, may also be provided in combination in a single embodiment. Conversely, various features of the invention, which are, for brevity, described in the context of a single embodiment, may also be provided separately or in any suitable sub-combination or as suitable in any other described embodiment of the invention. Certain features described in the context of various embodiments are not to be considered essential features of those embodiments, unless the embodiment is inoperative without those elements.

Additionally, the various embodiments set forth herein are described in terms of exemplary block diagrams, flow charts and other illustrations. As will become apparent to one of ordinary skill in the art after reading this document, the illustrated embodiments and their various alternatives can be implemented without confinement to the illustrated examples. For example, block diagrams and their accompanying description should not be construed as mandating a particular architecture or configuration.

What is claimed is:

1. A portable sputtering apparatus for repairing damaged surfaces, comprising:
   a cylindrical chamber, having a top and a bottom, wherein said chamber comprises a first welded flange for attachment to a high pressure vacuum system and a first tube with a circular flange at the distal end of the tube for attachment to an inert gas bottle, along the circumference of the chamber;
   a top chamber plate, connected to said top of said cylindrical chamber, having a plurality of apertures, comprising:
      a first aperture covered with a cathode housing, comprising a cathode coated with a material to be sputtered;
      a second aperture connected to a second tube with a circular flange at the end of the tube opposite an aperture for the discharge of pressure within said chamber; and
   a bottom chamber plate, having an aperture, connected to said bottom of said cylindrical chamber;
   a housing comprising an aperture, a first end, and a second end,
wherein said first end is connected to said chamber plate and said second end connects to the damaged surface; and
      a metal sheet, having an aperture, located within an aperture of a second housing for allowing sputtered composite material to flow onto said damaged surface.

2. The portable sputtering apparatus of claim 1, wherein the chamber is comprised of at least one of stainless steel, aluminum, and glass.

3. The portable sputtering apparatus of claim 1, wherein the material to be sputtered is selected from the group consisting of composite material and copper.

4. The portable sputtering apparatus of claim 1, wherein the cathode housing is secured to the top chamber plate by a plurality of hook clamp assemblies.

5. The portable sputtering apparatus of claim 1, wherein the cylindrical chamber further comprises a plurality of tubes with a circular flange at one end of the tubes, such that the end of the tube without the circular flange connects to the chamber and the end of the tube with the circular flange connects to an instrument.

6. The portable sputtering apparatus of claim 1, further comprising an O-ring between the top chamber plate and the cathode housing.

7. The portable sputtering apparatus of claim 1, further comprising an O-ring between the bottom chamber plate and the housing.

8. The portable sputtering apparatus of claim 1, wherein the second end of the housing further comprises an O-ring.

9. The portable sputtering apparatus of claim 1, wherein the second end of the housing has a curved surface.

10. The portable sputtering apparatus of claim 1, wherein a second housing is connected to the bottom chamber plate with a plurality of hook clamp assemblies.

11. The portable sputtering apparatus of claim 1, wherein the top chamber plate further comprises a third aperture and the third aperture is connected to a cylindrically shaped sleeve, having a lens and a cap, covering the lens, for viewing the cylindrical chamber.

12. A portable sputtering apparatus for repairing damaged surfaces comprising:
   a cylindrical chamber, having a top and a bottom, wherein said chamber comprises a welded flange for attachment to a high pressure vacuum system and a first tube with a circular flange for attachment to an inert gas bottle;
   a first cathode housing, comprising a cathode coated with a material to be sputtered, connected to said top of said cylindrical chamber;
   a second tube with a circular flange for the discharge of pressure within said chamber connected to said top of said cylindrical chamber;
   a housing comprising an aperture, a first end, and a second end,
wherein said first end is connected to said bottom of said chamber and said second end connects to said damaged surface; and
   a cylindrical chamber, having a top and a bottom, wherein said chamber comprises a welded flange and a first tube with a circular flange;
   a top chamber plate, connected to said top of said cylindrical chamber, having a plurality of apertures, comprising:
      a first aperture covered with a cathode housing, having a cathode coated with a material to be sputtered;
      a second aperture connected to a second tube with a circular flange; and
   a bottom chamber plate, having an aperture, connected to said bottom of said cylindrical chamber; and
   a metal sheet, having an aperture;
   placing said metal sheet inside said housing;
   attaching said first end of said housing to said bottom chamber plate;
   placing said portable sputtering apparatus with said housing, and said metal sheet into a frame weldment;
   attaching a vacuum gate valve to said welded flange;
   attaching an air cooled cryropump to the vacuum gate valve;
   attaching a rough mechanical pump to said air cooled cryopump;
   attaching a bottle of inert gas to said first tube with a circular flange;
loading said portable sputtering apparatus with said housing, said metal sheet, said frame weldment, said vacuum gate valve, said air cooled cryopump, said rough mechanical pump, and said inert gas bottle onto the damaged surface so that said second end of said housing is in contact with said damaged surface;
   a sheet, having an aperture located within said aperture of said housing for allowing sputtered composite material to flow onto said surface.

13. The portable sputtering apparatus of claim 12, wherein the chamber is comprised of at least one of stainless steel, aluminum, and glass.

14. The portable sputtering apparatus of claim 12, wherein the cylindrical chamber further comprises a plurality of tubes with a circular flange at one end of the tubes, such that the end of the tube without the circular flange connects to the chamber and the end of the tube with the circular flange connects to an instrument.

15. The portable sputtering apparatus of claim 12, further comprising an O-ring between the cylindrical chamber and the cathode housing.

16. The portable sputtering apparatus of claim 12, wherein the second end of the housing further comprises an O-ring.

17. The portable sputtering apparatus of claim 12, wherein the top of the chamber further comprises a cylindrically shaped sleeve, having a lens and a cap, covering the lens, for viewing the cylindrical chamber.

* * * * *